United States Patent [19]
Ohnishi et al.

[11] Patent Number: 5,495,110
[45] Date of Patent: Feb. 27, 1996

[54] OBSERVATION METHOD AND APPARATUS FOR REMOVING AN OXIDATION LAYER AND FORMING AN IMAGE FROM A SAMPLE

[76] Inventors: Tsuyoshi Ohnishi, Hitachiwing-218, 11-1, Aoba-cho; Tohru Ishitani, Hitachiwing-230, 11-1, Aoba-cho, both of Katsuta-shi, Ibaraki 312, Japan

[21] Appl. No.: 258,334

[22] Filed: Jun. 10, 1994

[30] Foreign Application Priority Data

Jul. 7, 1993 [JP] Japan .................................. 5-191871

[51] Int. Cl.⁶ .................. H01J 37/252; G01N 23/225
[52] U.S. Cl. ................................. 250/309; 250/307
[58] Field of Search ................................. 250/309, 307

[56] References Cited

U.S. PATENT DOCUMENTS

4,933,565  6/1990  Yamaguchi et al. .................. 250/309

Primary Examiner—Jack I. Berman

[57] ABSTRACT

The present invention is intended to form a satisfactory SIM image having high contrast without requiring comparatively high current density and high vacuum, and to enable satisfactory observation of grains in a high resolution at a reduced cost. An object area on a sample is divided virtually into a plurality of small areas, the small areas are irradiated sequentially in a time series mode with a surface processing beam and a data acquisition beam, the irradiation of each small area is executed, secondary signals produced by the sample when the sample is irradiated with the data acquisition beam, and an image of the object area on the sample is formed on the basis of the detected secondary signals.

21 Claims, 6 Drawing Sheets

IMAGE MEMORY (511,511)

OBSERVATION METHOD AND APPARATUS FOR REMOVING AN OXIDATION LAYER AND FORMING AN IMAGE FROM A SAMPLE

BACKGROUND OF THE INVENTION

The present invention relates to a focused ion beam scanning apparatus which scans a sample with focused ion beams to form an image in a high resolution, an observation method using focused ion beams, and a processing method using focused ion beams.

The focused ion beam scanning apparatus as an observation means for the observation of grains of wires and the like and a processing means capable of processing a work in an accuracy on the submicron order has been watched with keen interest with the progressive miniaturization of semiconductor devices. When observing grains of a sample, the surface of the sample is scanned with a focused ion beam (sometimes, abbreviated to "FIB") converged in a size on the submicron order, secondary electrons emitted from the surface of the sample are detected, and an enlarged image, i.e., a SIM image (scanning ion microscopic image), of a section of the sample or the structure of the sample is displayed on a display. Generally, the contrast of the SIM image is higher than that of the SEM image (scanning electron microscopic image).

A method of observing the grains of aluminum using an FIB is described in, for example, Proceedings of International Reliability Physics Symposium, pp. 43–52 (1989).

As is generally known, when a sample of a substance subject to oxidation, such as aluminum, is observed in an atmosphere having a low vacuum, an oxide film is formed over the surface of the sample to obstruct the observation of the grains. The oxide film formed over the surface of the sample can be removed by irradiating the same with an FIB. Therefore, the feasibility of the observation of the grains is dependent on the ratio between the rate of removal of the oxide film by irradiation with an FIB and the rate of formation of the oxide film by natural oxidation caused by the atmosphere of the sample chamber.

When observing a comparatively narrow area on a sample in a high magnification by repeating a scanning cycle at a comparatively short period, the grains can be comparatively satisfactorily observed because the succeeding scanning cycle is carried out before a new oxide film is formed after an old oxide film has been removed in the preceding scanning cycle. In the following description, "oxide film" refers to an oxide film including an oxygen adsorption layer. However, when observing a comparatively wide area on the sample in a low magnification by repeating a scanning cycle, the oxide film removing effect of the beam is diminished because the dwell time of the beam for unit area is shorter than that in the observation in a high magnification and, consequently, it is difficult to achieve satisfactory observation of the grains.

It is desirable, from the view point of observation, to obtain a SIM image of a wide area in a high resolution by using a very narrow primary beam. Although it is desirable for forming such a desirable SIM image (1) to increase the current density of the FIB or (2) to raise the vacuum level of the sample chamber, the means (1) has difficulties in forming a very narrow beam having a high current density, and the means (2) increases the cost of the apparatus because a sample stage, a vacuum pump and such suitable for establishing an ultra-high vacuum are expensive and a long time necessary for creating a high vacuum reduces the operation rate of the apparatus.

SUMMARY OF THE INVENTION

Accordingly, it is an object of the present invention to solve those problems in the prior art, to enable forming a SIM image in satisfactory contrast, and to enable the observation of grains in a high resolution at a low cost without requiring a high current density or a high vacuum.

With the foregoing object in view, the present invention divides an object area virtually into a plurality of small areas, projects a first beam and a second beam sequentially in a time series mode on the small areas, detects secondary signals produced by the sample when the sample is irradiated with the second beam, and forms an image of the object area on the basis of the secondary signals relating to the small areas.

Since the object area is divided virtually into a plurality of small areas and each small area is irradiated with the first beam and the second beam in a time series mode, the small area is irradiated with the second beam immediately after the completion of irradiation with the first beam. Since the small area is irradiated with the second beam after an oxide film has been removed with the first beam and before a new oxide film is formed, the second beam falls directly on the surface of the sample proper. Since an image of the surface is formed by using the secondary signals produced while the sample is being irradiated with the second beam, the second signals do not include secondary signals produced by an oxide film and the image does not include any information about an oxide film.

BRIEF DESCRIPTION OF THE DRAWINGS

The above and other objects, features and advantages of the present invention will become more apparent from the following description taken in connection with the accompanying drawings, in which.

DETAILED DESCRIPTION OF THE PREFERRED EMBODIMENTS

Figure 1:
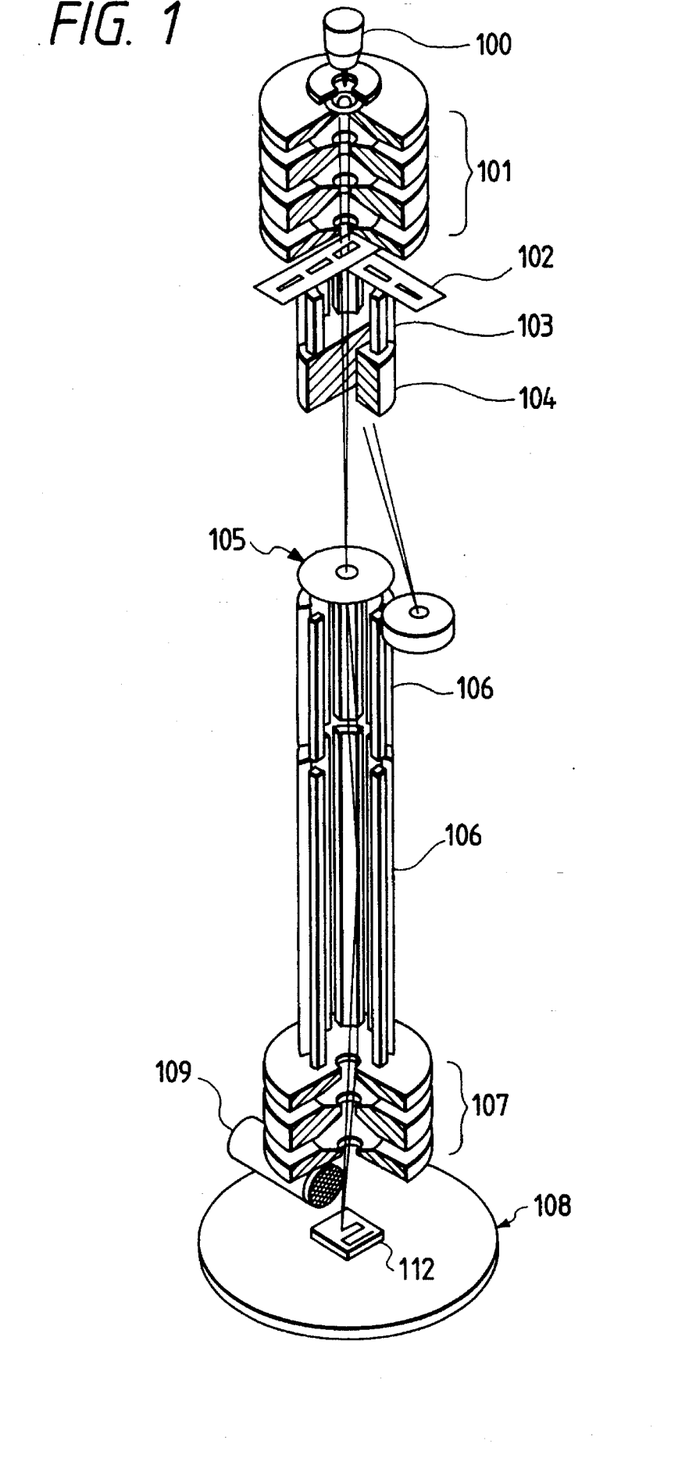
FIG. 1 is a perspective view of an optical system included in a focused ion beam scanning apparatus embodying the present invention.

Referring to FIG. 1 showing the principal part of an optical system included in a focused ion beam scanning apparatus embodying the present invention, ions emitted by a liquid metal ion source are focused by a condenser lens 101 and an objective lens 107 on a sample 112. Beam accelerating voltage is 30 kV. A variable aperture 102, an aligner/stigmator 103, a blanker 104, a blanking aperture 105 and a deflector 106 are arranged between the lenses 101 and 107. The sample 112 is placed on a five-axis stage 103 capable of being moved along the X-axis, the Y-axis and the Z-axis, of being tilted and of being turned. Secondary electrons produced by the sample 112 when the sample 112 is irradiated with a FIB are detected by a secondary electron detector 109.

Figure 2:
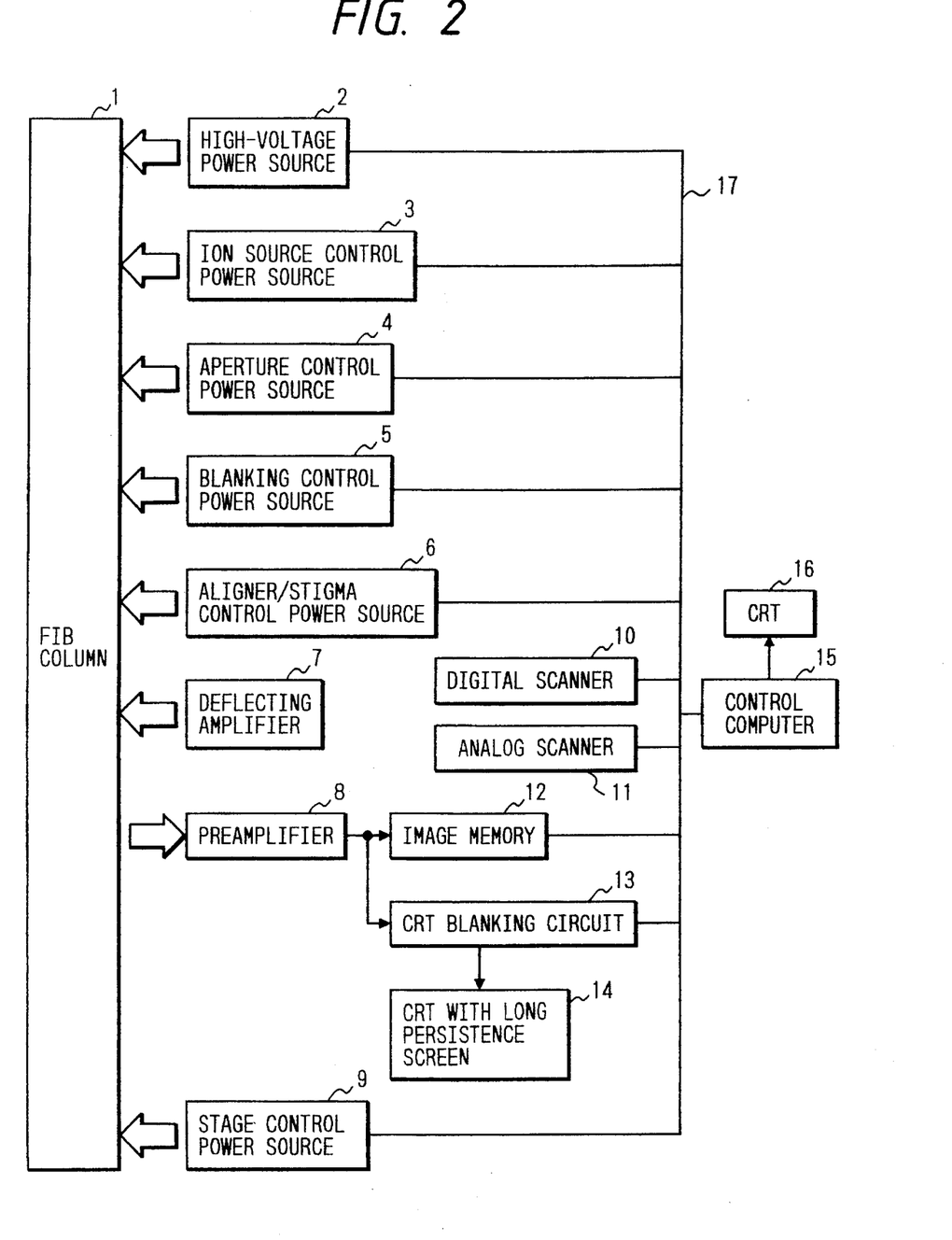
FIG. 2 is a block diagram of a control system included in a focused ion beam scanning apparatus embodying the present invention.

FIG. 2 is a block diagram of a principal part of a control system included in the focused ion beam scanning apparatus.

The components of the focused ion beam scanning apparatus are controlled through a control bus 17 by a control computer 15. An ion source control power source 3 controls currents for heating an ion source 100 and emitting ions. An aperture control power source 4 controls the position of the center and the size of the aperture. A blanking control power source 5 inhibits the unnecessary irradiation of the sample 112 with an ion beam. An aligner/stigmator control power source 6 corrects alignment and compensates astigmatism. A deflection amplifier 7 amplifies and processes the output signals of a digital scanner 10 and an analog scanner 11 to drive the deflector 106.

A preamplifier 8 amplifies the output signal of the secondary electron detector 109 and subjects the same to current/voltage conversion. An image memory 12 stores data obtained through the A/D conversion of the output signal of the preamplifier 8. In this embodiment, it is supposed that the image memory 12 comprises 512×512 pixels and each pixel has 8-bit gradations. The data stored in the image memory 12 is transferred through the control bus 17 to the control computer 15 to display a SIM image on a CRT 16. The output signal of the preamplifier 8 is transferred as a luminance signal through a CRT blanking control circuit 13 to a CRT 14 with long persistence screen in synchronism with the scanning operation of the analog scanner 11 to display a SIM image on the persistent CRT 14. Since this SIM image is formed by thousands of scanning lines, this SIM image is used for photography. A stage controlled power source 9 drives the sample stage 108 to position a desired area of the sample 112 in a FIB deflecting area.

Figure 3:
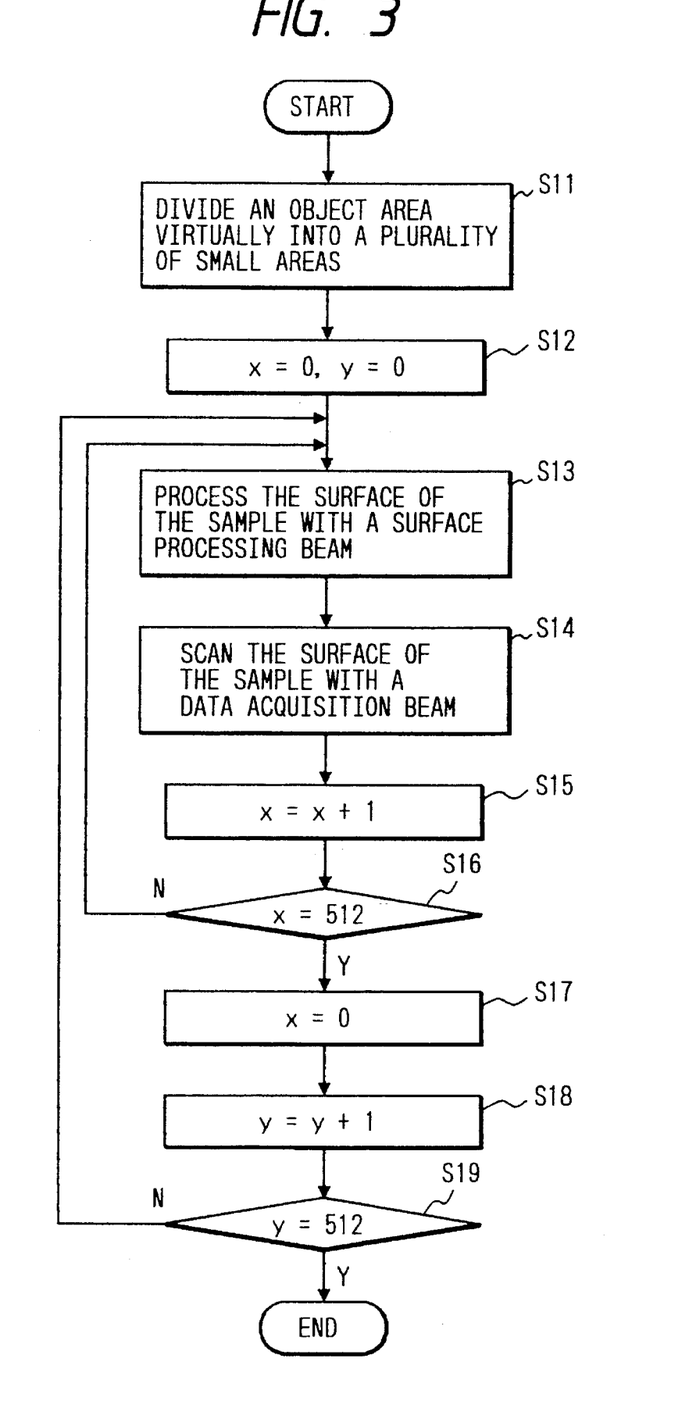
FIG. 3 is a flow chart of an observation method in a preferred embodiment according to the present invention.

An observation method in accordance with the present invention will be described hereinafter with reference to flow charts. FIG. 3 is a flow chart of steps of observation operation employing the digital scanner 10.

Figure 4A:
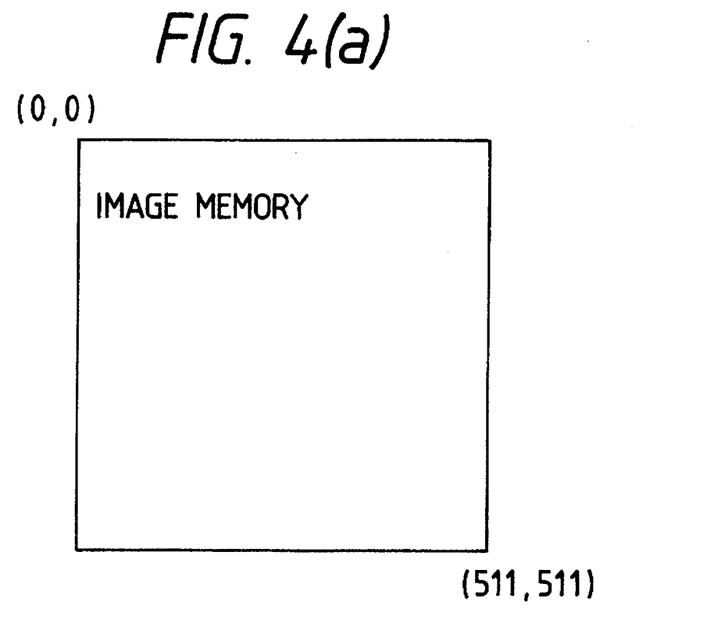
FIGS. 4(a) and 4(b) are diagrammatic views of assistance in explaining the relation between an address on an image memory and a beam deflecting area.
Figure 4B:
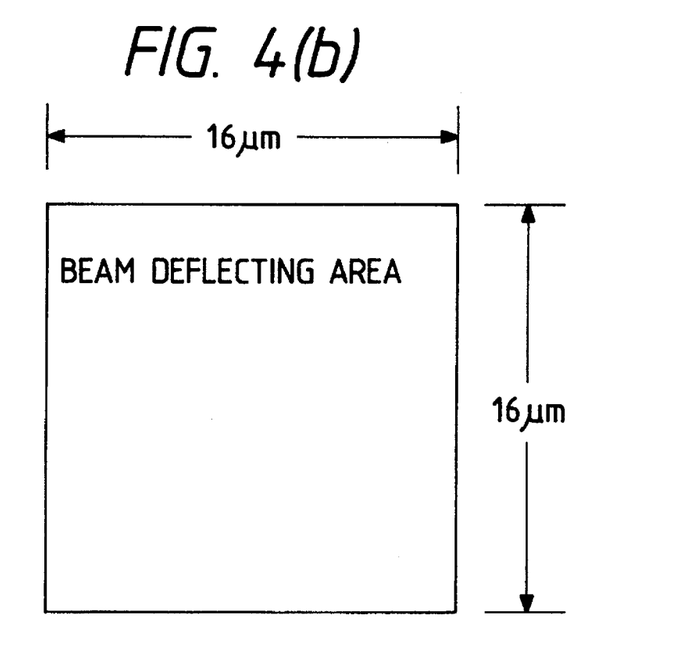

In step S11, an object area is divided virtually into 512×512 small areas having equal longitudinal and lateral lengths, and the addresses of the image memory 12 are allocated to the small areas. In this embodiment, the image memory 12 has a storage area corresponding to 512×512 pixels, and the size of a beam deflecting area is 16 μm×16 μm as shown in FIGS. 4(a) and 4(b). Therefore, the pitch of beam deflecting points corresponding to the addresses in the image memory 12 is about 0.03 μm (=16/512 μm). In step S12, variables x and y for specifying addresses in the image memory 12 are reset to zero.

Figure 5A:
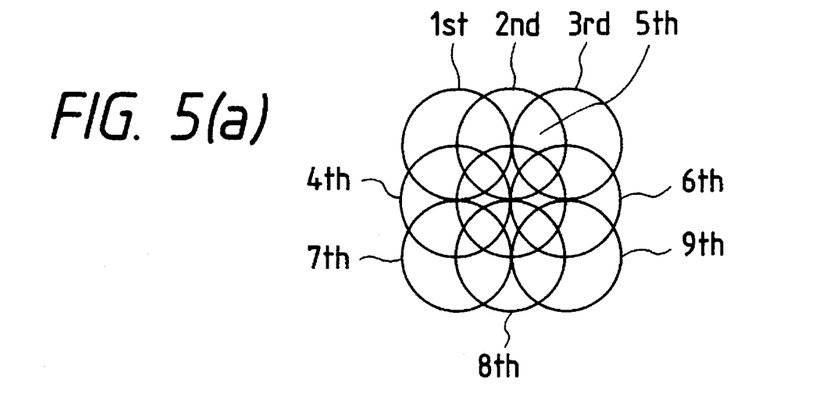
FIGS. 5(a) and 5(b) are diagrammatic views showing the relative positions of surface processing beams and observation beams in a small area when carrying out the observation method in a first embodiment according to the present invention.

In step S13, a processing FIB for processing the surface of the sample is projected on the beam deflecting points in a small area corresponding to an address of the image memory 12 to remove an oxide film. The intensity of the processing FIB is distributed along the diameter of the same substantially in a Gaussian distribution. The diameter of the processing FIB is defined by a width in which the intensity of the processing FIB is equal to or higher than a specified intensity. Therefore part of the small area on the sample outside a circle of the defined beam diameter is irradiated with part of the processing FIB, having a low intensity and, consequently, nine beam deflecting points at the first to the ninth position are irradiated in a first scanning cycle through a ninth scanning cycle, with the processing FIB so that the halves of the adjacent FIB spots overlap each other as shown in FIG. 5(a). The overlapping part of each beam spot may be ⅓, ⅔ or ¼ of the beam spot, and the degree of overlapping may be dependent on the intensity of the FIB and the material of the sample. When the surface of the sample is irradiated with the processing FIB so that the adjacent spots overlap each other, no land of the oxide film remains in the surface of the sample. The diameter of the processing FIB employed in this embodiment is 0.025 μm. Thus, part of the oxide film around the beam deflecting point corresponding to the address can be removed. The processing FIB need not necessarily be projected so as to irradiate the first to ninth beam deflecting points sequentially in that order, but may be projected so as to irradiate the first to ninth beam deflecting points in any order.

Figure 5B:
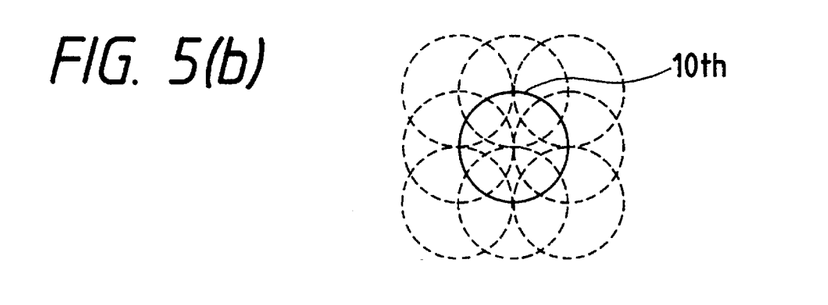

After the beam deflecting points at the first to the ninth position have been irradiated with the processing FIB, a data acquisition FIB is projected on the deflecting point at the fifth position corresponding to the address as shown in FIG. 5(b) in the tenth scanning cycle in step S14, the secondary electron detector 109 detects secondary electrons produced by the sample, the output signal of the secondary electron detector 109 is subjected to A/D conversion, and data obtained by the A/D conversion is stored in the image memory 12. Since there is no oxide film which is irradiated with part of the data acquisition FIB outside the circle of the defined beam diameter, having a low intensity, the quality of the SIM image is not deteriorated by secondary electrons that will be produced when an oxide film is irradiated with the data acquisition FIB. In this embodiment, the processing FIB used in step S13 and the data acquisition FIB used in step S14 are the same in irradiating conditions. Naturally, the processing FIB and the data acquisition FIB may be different from each other in intensity; particularly, the intensity of the data acquisition FIB used in step S14 may be selectively determined according to the properties of the material of the sample.

After the acquisition of the data for one pixel of the image memory 12 has been completed, the variable x is incremented by 1 (one) in step S15. In step S16, a query is made to see if the variable x=512, namely, if the acquisition of the data of one line has been completed, and steps S13 through S16 are repeated until the acquisition of the data of one line is completed.

After the completion of the acquisition of the data of one line, the variable x is reset again to 0 (zero) in step S17, and then the variable y is incremented by 1 (one) in step S18. In step S19, a query is made to see if the variable y=512, namely, if the collection of the data for one image memory has been completed. Steps S13 to S18 are repeated until the collection of the data for one image memory is completed. Finally, a SIM image of the area of 16 μm×16 μm is formed.

Since this embodiment repeats the surface processing cycle and the data collecting cycle in a time series mode for each pixel, the data of the surface of the sample from which the oxide film has been removed can be acquired. Accordingly, the bare surface of the sample, namely, the surface of the sample not coated with any oxide film, can be observed and, consequently, the satisfactory observation of the grains in the surface of the sample can be achieved.

Figure 6:
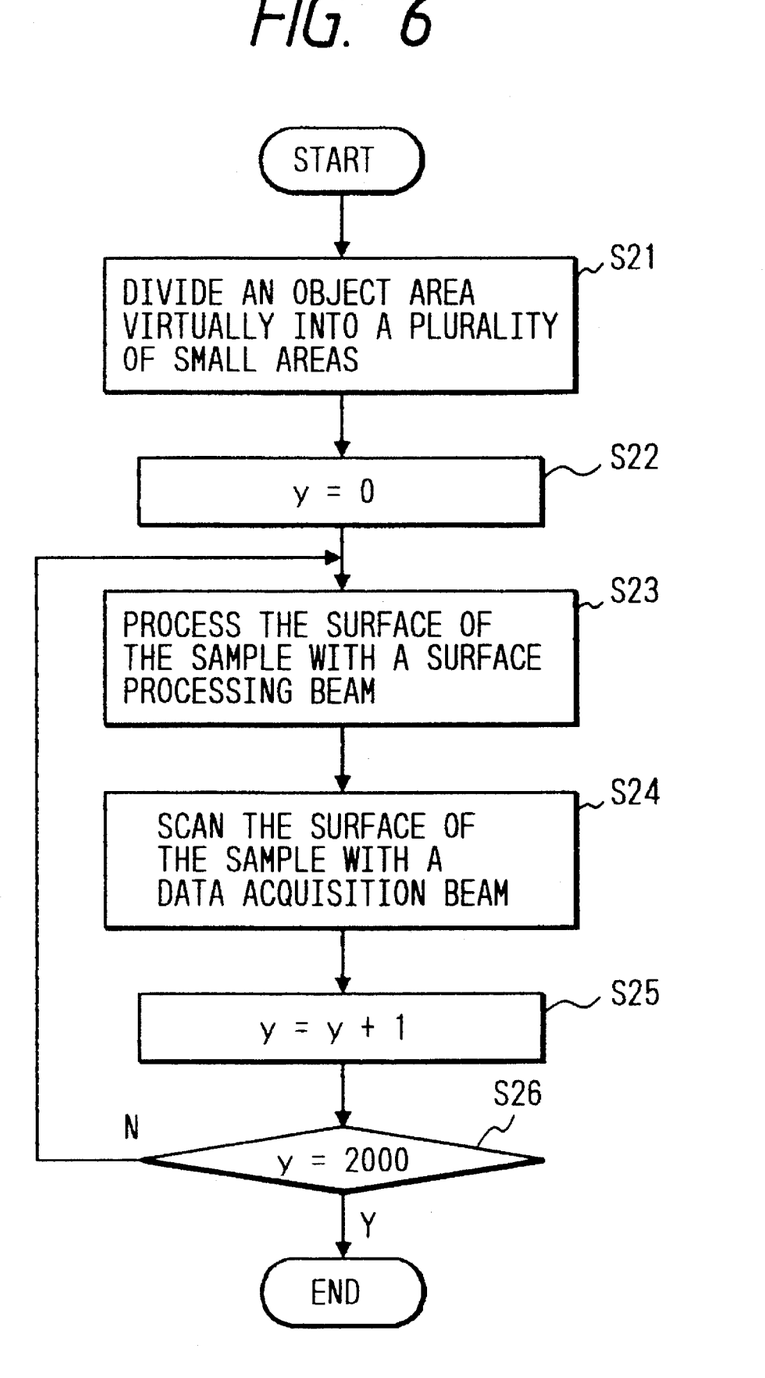
FIG. 6 is a flow chart of an observation method in a second embodiment according to the present invention.

FIG. 6 is a flow chart of an observation method employing the analog scanner 11. In this case, the secondary electron signals are used as luminance signals for the persistent CRT 14 to display a SIM image on the persistent CRT 14.

In step S21, the object area is divided into a plurality of small areas at substantially equal longitudinal intervals, and the scanning width and the scanning pitch of scanning lines are determined on the basis of a specified magnification. The analog scanner 11 generates a triangular wave propagating along the X-axis and a stepped wave propagating along the Y-axis on the basis of the scanning width and the scanning pitch. In step S22, the variable y, which indicates a scanning position (scanning line) with respect to the Y-axis, is reset to 0 (zero).

Figure 7A:
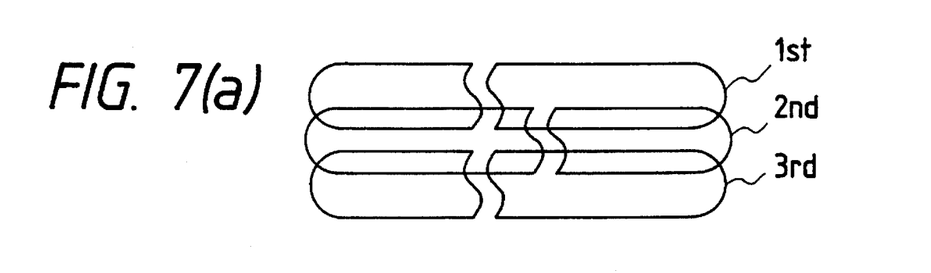
FIGS. 7(a) and 7(b) are diagrammatic views showing the relative positions of surface processing beams and data acquisition beams in a small area in carrying out the observation method in the second embodiment

In step S23, a processing FIB is moved along a scanning line specified by the variable y to remove the oxide film. Since the intensity of the processing FIB is distributed along the diameter of the processing FIB, the processing FIB sweeps over three lines respectively at a first to a third position so that the half of the spot of the processing FIB sweeping over the line at the first position in the first scanning cycle and the half of the spot of the same sweeping over the line at the third position in the third scanning cycle overlap an area scanned with the processing FIB along the line at the second position corresponding to a scanning line specified by the variable y in the second scanning cycle as shown in FIG. 7(a) to remove the oxide film perfectly. Thus, no oxide film remains in the processed area. When scanning the area along the lines at the first to third positions with the processing FIB, the CRT blanking circuit 13 is controlled so as to fix the luminance of the CRT on the level of black.

Figure 7B:
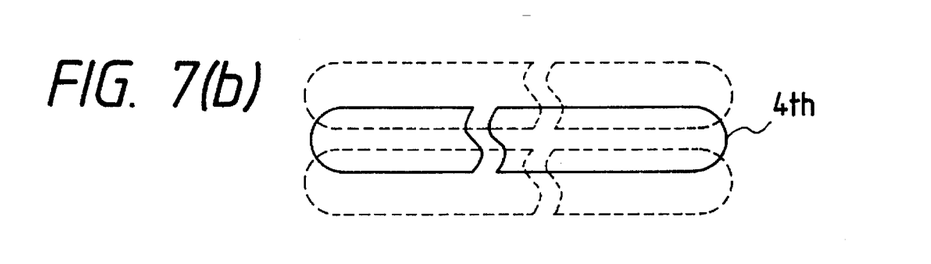

After scanning the area with the processing FIB along the lines at the first to the third position, in step S24, a data acquisition FIB is projected on a deflecting point corresponding to the variable y, i.e., a deflecting point on the second line along which the processing FIB scanned the area in the surface processing process, in the fourth scanning cycle, as shown in FIG. 7(b), and then secondary electrons produced by the sample are detected by the secondary electron detector 109. In the fourth scanning cycle, the CRT blanking circuit 13 is set in a transmission state to use the output secondary electron signal of the secondary electron detector 109 as a luminance signal for displaying the scanning line on the persistent CRT 14.

In step S25, the variable y is incremented by 1 (one), and then a query is made in step S26 to see if the variable y=2000, namely, if the scanning cycle has been repeated to form 2000 scanning lines on the CRT 14. If the response in step S26 is affirmative, the procedure is ended. Then, a SIM image displayed on the CRT 14 is photographed to obtain a photograph having a high resolution.

Since this embodiment repeats the surface processing process and the data collecting process in a time series mode for each scanning line, the data of the bare surface of the sample from which the oxide film has been removed by the surface processing process can be collected. Consequently, the bare surface not coated with any oxide film can be observed to achieve satisfactory observation of grains.

In the foregoing embodiments, the processing FIB used in the processing process and the data acquisition FIB used in the data collecting process are the same in irradiating conditions, and a wide area around a desired area is irradiated with the processing FIB before collecting the data of the desired area. However, the FIB may be concentrated in a large spot to enlarge an area which is scanned in each scanning cycle or, if the deterioration of the image quality is not a problem, the same position may be irradiated with the FIBs in both the surface processing process and the data acquisition process.

The condition of the oxide film formed by natural oxidation over the surface of the sample is dependent on the vacuum level of the sample chamber. Accordingly, it is possible to form a satisfactory SIM image for grain observation by measuring the vacuum level of the sample chamber, and properly determining the irradiating conditions including the dwell time of the spot and the energy of the FIB to be used in the surface processing process on the basis of information obtained through the measurement of the vacuum level of the sample chamber to expose the bare surface of the sample with the least unavoidable damage in the surface.

As is apparent from the foregoing description, according to the present invention, an area in the surface of a sample to be observed is divided virtually into a plurality of small areas, and each small area is irradiated with a surface processing beam and a data acquisition beam in a time series mode. Therefore, an oxide film coating the small area can be removed with the surface processing beam to expose the bare surface of the sample, and then the bare surface of the sample can be irradiated with the data acquisition beam before a new oxide film is formed over the small area. Accordingly, a secondary signal provided on the basis of secondary electrons emitted by the area irradiated with the data acquisition beam forms a SIM image having a high contrast and enabling satisfactory grain observation even if the current density of the FIB and the degree of vacuum of the sample chamber are not necessarily appropriate.

What is claimed is:

1. A method for removing an oxidation layer and forming an image of a sample by scanning the sample in an environment containing oxygen with a focused ion beam, comprising:

removing oxidation from an area of a sample;

removing oxidation from a periphery of the area;

producing secondary signals from the area before oxidation forms; and forming an image of the area from the secondary signals.

2. A method as in claim 1, wherein said removing from the area comprises irradiating the area with a focused ion beam.

3. A method as in claim 1, wherein said removing from the periphery comprises irradiating the periphery with a focused ion beam.

4. A method as in claim 1, wherein said producing comprises irradiating the area with a focused ion beam.

5. A method as in claim 1, wherein said removing from the area, said removing from the periphery and said producing comprises irradiation with a single focused ion beam.

6. A method as in claim 1, further comprising:

dividing the sample into a plurality of areas, each of the plurality having a periphery associated therewith;

measuring vacuum in the vicinity of the sample to control the duration of said removing from the area and said removing from the periphery;

removing oxidation from the areas and peripheries in a time series mode; and, producing secondary signals from each area in a time series mode.

7. A method as in claim 6, wherein said dividing is of the sample in substantially equal longitudinal intervals.

8. A method as in claim 6, wherein said dividing is of the sample in substantially equal longitudinal and lateral intervals.

9. A method as in claim 6, wherein said producing from each area is performed between said removing of oxidation from one of the plurality of areas and said removing of oxidation from a subsequent one of the plurality of areas.

10. A method as in claim 6, further comprising storing data from said producing between said removing oxidation from one of the plurality of areas and said removing of oxidation from a subsequent one of the plurality of areas.

11. A method as in claim 3, wherein said removing from the periphery comprises increasing the diameter of the focused ion beam from a relatively smaller diameter during said removing from the area to a relatively larger diameter during said removing from the periphery.

12. A method as in claim 3, wherein said removing from the periphery comprises perturbing the position of the focused ion beam from its position during said removing from the area to periphery positions during said removing from the periphery.

13. A method as in claim 6, further comprising blanking the focused ion beam so that the focused ion beam is not "on" during predetermined periods.

14. A focused ion beam scanning apparatus which removes an oxidation layer and forms an image of a sample located in an environment containing oxygen, comprising:

a remover of oxide from an area of a sample;

a remover of oxide from a periphery of the area;

a producer of secondary signals from the area that operates before oxide forms; and, a former of an image from the secondary signals which represents the sample.

15. An apparatus as in claim 14, wherein said remover from the area is a focused ion beam.

16. An apparatus as in claim 14, wherein said remover from the periphery is a focused ion beam.

17. An apparatus as in claim 14, wherein said producer is a focused ion beam.

18. An apparatus as in claim 14, wherein said remover from the area, said remover from the periphery, and said producer are a single focused ion beam.

19. An apparatus as in claim 14, further comprising:

a divider that divides the sample into a plurality of areas which are each geometrically similar to the area focused upon by said remover from the area;

a mover that moves said remover from the area, said remover from the periphery, and said producer from one of the plurality of areas to another on the sample, so that said remover from the area, said remover from the periphery, and said producer can act upon each one of the plurality of areas in a time series mode;

a measurer that measures vacuum in the vicinity of the sample and controls the duration of operation of said remover from the area and said remover from the periphery; and, a storer of data obtained from the secondary signals which stores the data at each stage of the time series mode.

20. An apparatus as in claim 14, further comprising a blanker for blanking said remover from the area, said remover from the periphery and said producer so that they can be in "off" and "on" modes of operation.

21. An apparatus as in claim 14, further comprising:

a divider that divides the sample into a plurality of areas which are each geometrically similar to the area focused upon by said remover from the area;

a mover that moves said remover from the area, said remover from the periphery, and said producer from one of the plurality of areas to another on the sample, so that said remover from the area, said remover from the periphery, and said producer can act upon each one of the plurality of areas in a time series mode;

a blanker for blanking said remover from the area, said remover from the periphery and said producer so that they can be in "off" and "on" modes of operation; and, a storer of data obtained from the secondary signals.

* * * * *